(12) United States Patent
Takase et al.

(10) Patent No.: US 7,151,228 B2
(45) Date of Patent: Dec. 19, 2006

(54) LAMINATING DOUBLE-SIDE CIRCUIT BOARD, MANUFACTURING METHOD THEREOF, AND MULTILAYER PRINTED CIRCUIT BOARD USING SAME

(75) Inventors: Yoshihisa Takase, Higashiosaka (JP); Tsuneshi Nakamura, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 209 days.

(21) Appl. No.: 10/203,971

(22) PCT Filed: Jan. 29, 2002

(86) PCT No.: PCT/JP02/00639

§ 371 (c)(1),
(2), (4) Date: Oct. 1, 2002

(87) PCT Pub. No.: WO02/062116

PCT Pub. Date: Aug. 8, 2002

(65) Prior Publication Data
US 2004/0104042 A1 Jun. 3, 2004

(30) Foreign Application Priority Data
Jan. 30, 2001 (JP) ............................... 2001-021152

(51) Int. Cl.
H05K 1/03 (2006.01)
(52) U.S. Cl. ...................... 174/255; 174/262; 174/265; 361/795
(58) Field of Classification Search ........ 174/255–266; 361/792–795; 257/700–704; 428/209–210
See application file for complete search history.

(56) References Cited

U.S. PATENT DOCUMENTS

| | | | | | |
|---|---|---|---|---|---|
| 4,964,948 A | * | 10/1990 | Reed | ............................ | 216/18 |
| 4,967,314 A | * | 10/1990 | Higgins, III | ................. | 361/792 |
| 5,601,672 A | * | 2/1997 | Casey et al. | ............. | 156/89.16 |
| 5,888,627 A | * | 3/1999 | Nakatani | ..................... | 428/209 |
| 6,329,603 B1 | * | 12/2001 | Japp et al. | ................... | 174/255 |
| 6,329,610 B1 | * | 12/2001 | Takubo et al. | ............... | 174/264 |
| 6,563,057 B1 | * | 5/2003 | Hotta et al. | .................. | 174/262 |

FOREIGN PATENT DOCUMENTS

| | | |
|---|---|---|
| EP | 0 964 610 A2 | 12/1999 |
| JP | 2000-174404 | 6/2000 |
| JP | 2000-188471 | 7/2000 |
| JP | 2000-269847 | 9/2000 |
| JP | 2000-286549 | 10/2000 |

* cited by examiner

Primary Examiner—Kamand Cuneo
Assistant Examiner—Tuan Dinh
(74) Attorney, Agent, or Firm—Steptoe & Johnson LLP

(57) ABSTRACT

The present invention comprises a plurality of laminating double-side circuit boards and a plurality sheets of prepreg for interlayer connection that are placed one on another. Via holes extend from the circuit on one side of each laminating double-side circuit board to the circuit on the other side thereof. Each via hole is filled with electro-conductive material to connect the circuits on both sides of the laminating double-side circuit board. The pad on a laminating double-side circuit board and the pad on another laminating double-side circuit board are laminated via a sheet of prepreg for interlayer connection so that the respective pads are opposed to each other via the through hole filled with electro-conductive material formed through the sheet of prepreg for interlayer connection. Thereby, the respective pads on the laminating double-side wiring circuit boards are electrically connected with one another. Thus, the present invention can provide a multilayer printed wiring board having shorter production time, excellent reliability, and high yield.

10 Claims, 3 Drawing Sheets

PRIOR ART

LAMINATING DOUBLE-SIDE CIRCUIT BOARD, MANUFACTURING METHOD THEREOF, AND MULTILAYER PRINTED CIRCUIT BOARD USING SAME

FIELD OF THE INVENTION

The present invention relates to a laminating double-side circuit board used to manufacture a multilayer printed wiring board having an interstitial via hole (IVH) structure. It also relates to a manufacturing method of the circuit board and a multilayer printed wiring board using the circuit boards.

BACKGROUND OF THE INVENTION

Commonly, a conventional multilayer printed wiring board is made by alternately placing copper-clad laminates and sheets of prepreg one on another and integrating them. Such a multilayer printed wiring board has circuit patterns having outer layer pads formed therein, on the surfaces of the wiring board, and circuit patterns having inner layer pads formed therein, on the interlayer insulating layers of the wiring board.

These circuit patterns having these pads formed therein are electrically connected with each other via through holes drilled between each wiring layer in the direction of the thickness of the laminate.

However, for the above-mentioned multilayer printed wiring board having the through hole structure, areas for forming through holes need to be ensured. This imposes limitation to high-density packaging of electronic components. Thus, this poses problem that such a wiring board cannot sufficiently meet the requirements of microminiaturization of portable electronic equipment, and commercial use of a narrow pitch package and a multi chip module (MCM), for example.

For this reason, instead of such a multilayer printed wiring board having the through hole structure, a multilayer printed wiring board having an interstitial via hole structure throughout layers (hereinafter simply referred to as "IVH structure") suitable for high-density packaging of electronic circuits has recently been drawing attention.

This multilayer printed wiring board having the IVH structure is structured so that each interlayer insulating layer constituting the laminate has via holes for electrically connecting circuits having pads formed therein.

Such a printed wiring board has the features in that the circuit patterns, each having inner layer pads formed therein, or the circuit pattern having inner layer pads and the circuit pattern having outer layer pads are electrically connected with each other by via holes that do not penetrate through the wiring board (buried via hole or blind via hole). Because of this structure, the multilayer printed wiring board having the IVH structure need not have the areas for forming through holes and each wiring layer can be connected by micro-via-holes only. This structure facilitates the miniaturization, higher-density packaging, and high-speed propagation of signals of electronic equipment.

Such a multilayer printed wiring board having the IVH structure is manufactured by the process shown in FIGS. 3A to 3E, for example.

As shown in FIG. 3A, used as prepreg 51 is a material made of aramid unwoven cloth impregnated with epoxy resin. First, this prepreg 51 is drilled using carbon dioxide gas laser. Then, this opening 52 is filled with electro-conductive paste 53.

Next, as shown in FIG. 3B, copper foils 54 are laminated on both sides of prepreg 51 and the laminate is heated and pressed using a hot press. Then, the epoxy resin and electro-conductive paste 53 in prepreg 51 are cured and copper foils 54 on both sides are electrically connected.

Next, copper foils 54 are patterned by etching to provide a hard double-side printed wiring board having a via hole as shown in FIG. 3C.

This double-side printed wiring board is used as a core layer. As shown in FIG. 3D, sheets of prepreg having electro-conductive paste filled therein and copper foils are positioned and successively laminated on both sides of the core layer. Then, the laminate is hot-pressed again and the copper foils 54 of the outermost layers are etched to provide a multilayer printed wiring board having a four-layer wiring structure, as shown in FIG. 3E.

For further multi-layered wiring, repeating the above-mentioned steps can provide a multilayer printed wiring board of six layers or eight layers.

However, the above-mentioned conventional technique has the following problems.

(1) For multi-layering, the process of lamination by hot-pressing and the process of patterning copper foils by etching need to be repeated many times. This makes the manufacturing process complicated and necessitates a considerable production time.

(2) For printed wiring boards having the IVH structure obtained by such a manufacturing method, patterning failure occurring even in only one part (one step) of the manufacturing process may cause the failure of the entire printed wiring board, i.e. a final product. This drastically reduces the yield thereof.

The present invention addresses such problems. Therefore, it is an object of the present invention to provide a laminating double-side circuit board that is suitable for production of a high-density multilayer printed wiring board having the IVH structure and capable of providing excellent electrical connection reliability of via holes for connecting wiring layers. It is another object of the present invention to provide a manufacturing method of the circuit board and a multilayer printed wiring board using the circuit boards.

DISCLOSURE OF THE INVENTION

The present invention comprises laminating double-side circuit boards and sheets of prepreg for interlayer connection placed one on another. Each of the laminating double-side circuit boards has circuits having pads formed therein, on both sides of an insulated substrate. Via holes extend from the circuit on one side to the another circuit on the other side. The via holes are filled with electro-conductive material to connect the circuits on both sides.

The via hole in the laminating double-side circuit board is formed by any one of the following three means:

(1) Using UV-YAG laser, the copper foil on one side and the insulated substrate layer are drilled just before the copper foil on the other side while the output and pulse width of the laser are controlled.

(2) After the copper foil on one side is drilled using YAG laser, the insulated substrate layer is drilled just before the copper foil on the other side, using carbon dioxide gas laser.

(3) Using carbon dioxide gas laser, the copper foil on one side and the insulated substrate layer are drilled just before the copper foil on the other side while the pulse energy of the laser is controlled.

Subsequently, a plating-resistant tape is adhered to the surface of one of the metal layers formed on both sides of the insulated substrate that has no holes formed therethrough, except for a power supply portion. Power is supplied via the power supply portion and electrolytic copper plating is performed to form via holes for connection. Then, circuit patterns are formed by etching to provide a laminating double-side circuit board.

On the other hand, a sheet of prepreg for interlayer connection is made by the steps of: preparing a sheet of an uncured prepreg of aramid unwoven cloth impregnated with epoxy resin; drilling the uncured prepreg, using carbon dioxide gas laser; and filling the opening with electro-conductive material.

The multilayer printed wiring board of the present invention has the following structure. The pad on a laminating double-side circuit board and the pad on another laminating double-side circuit board are laminated via a sheet of prepreg for interlayer connection so that the respective pads on the laminating double-side circuit boards are opposed to each other via a through hole filled with the electro-conductive material through the prepreg. Thereby, the respective pads on both sides of the laminating double-side wiring circuit boards are electrically connected with one another.

Thus, the present invention can provide a multilayer printed wiring board that has a reliable laminated board structure, simplified manufacturing process, shorter lead time, and higher yield.

PREFERRED EMBODIMENTS OF THE INVENTION

Exemplary embodiments of a laminating double-side circuit board and a multilayer printed wiring board of the present invention are demonstrated hereinafter with reference to FIGS. 1A to 1H.

Figure 1A:
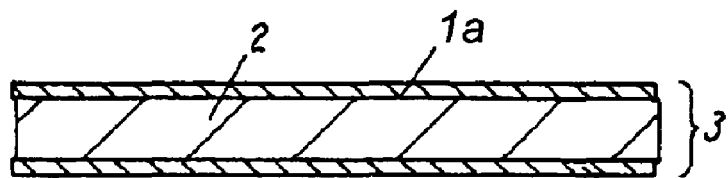
FIGS. 1A to 1H are sectional views showing a part of a process of manufacturing a laminating double-side circuit board in accordance with the present invention.

First, as shown in FIG. 1A, metal layers 1a and 1b are adhered to each side of insulated substrate 2 to form double-side copper-clad laminate 3. The insulated substrate is made of an insulating material selected from epoxy resin impregnated glass-cloth substrate, epoxy resin impregnated aramid-unwoven cloth substrate, polyimide resin impregnated glass-cloth substrate, polyimide resin impregnated aramid-unwoven cloth substrate, bismaleimide-triazine resin laminate, and the like.

Copper foils can be used as metal layers 1a and 1b adhered to both sides of insulated substrate 2. Preferably, copper foils are treated to have roughened surfaces to improve adhesive properties thereof.

Alternatively, metal layers 1a and 1b can be copper deposit formed on the surfaces of insulated substrate 2 by electroless copper plating followed by electrolytic copper plating.

Preferably, the thickness of insulated substrate 2 ranges 50 to 100 µm. With a thickness less than 50 µm, the substrate is too weak to be handled and mass-produced. With a thickness exceeding 100 µm, it is difficult to form micro-via-hole-forming openings and such a substrate hardly suits to electronic equipment where lightness and thinness are required.

As for metal layers 1a and 1b, it is preferable that the thickness of metal layer 1b on the side to be drilled ranges 3 to 18 µm and the thickness of metal layer 1a on the side not to be drilled ranges 5 to 18 µm.

When via-hole-forming openings are formed in the insulated substrate by laser machining, the drilling operation is easier with thinner metal layer 1b on the side to be drilled. However, with a thickness less than 3 µm, problems in electrical and mechanical properties hinder formation of metal layers suitable for mass-production. With a thickness exceeding 18 µm, formation of fine patterns by etching is difficult. When the thickness of metal layer 1a on the side not to be drilled is less than 5 µm, the metal layer may be penetrated through.

Preferably, a double-side copper-clad laminate of glass-cloth-substrate epoxy resin is used as insulated substrate 2 and metal layers 1a and 1b. The double-side copper-clad laminate is obtained by interposing a sheet of B-staged prepreg made of a glass cloth impregnated with epoxy resin between copper foils and hot-pressing these materials.

Figure 1B:
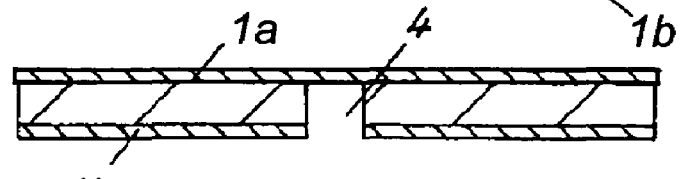

Next, as shown in FIG. 1B, laser radiation is performed in a desired position on one side of double-side copper-clad laminate 3 to form via-hole-forming opening 4 that penetrates through metal layer 1b and insulated substrate 2 and extends to the other metal layer 1a.

There are three methods of drilling via-hole-forming opening 4.

A first method is irradiating the side of metal layer 1b on insulated substrate 2 with UV-YAG laser, to form via-hole-forming opening 4.

A second method is irradiating metal layer 1b on insulated substrate 2 with YAG laser to drill a hole, and thereafter irradiating insulated substrate 2 with carbon dioxide gas laser, to form via-hole-forming opening 4.

A third method is irradiating the side of metal layer 1b on insulated substrate 2 with carbon dioxide gas laser and drilling metal layer 1b and the insulated substrate layer, while controlling the energy of the laser, to form via-hole-forming opening 4.

In the third method, it is important that the carbon dioxide gas laser pulse energy to metal layer 1b is at least 19 mJ and that to insulated substrate 2 is 0.5 to 5 mJ. When metal layer 1b is drilled with a laser pulse energy less than 19 mJ, burrs are generated and obtaining smooth drilled surfaces is difficult. As for insulated substrate 2, it is difficult to drill with a laser pulse energy less than 0.5 mJ. With a laser pulse energy exceeding 5 mJ, the drilled surface is rough, the cut surface of the glass cloth has glass-bead-like slug, or metal layer 1a at the bottom of the via hole tends to severely be damaged.

In addition, it is preferable that the diameter of via-hole-forming opening 4 formed in double-side copper-clad laminate 3 of this embodiment ranges 30 to 250 µm. With a diameter of the opening less than 30 µm, the opening is difficult to be filled with electro-conductive material, and moreover, connection reliability decreases. With a diameter of the opening exceeding 250 µm, it is difficult to fill the opening with electro-conductive material completely.

In order to ensure connection reliability, it is preferable to subsequently perform desmear treatment, e.g. chemical treatment, oxygen plasma treatment, corona discharge, for removing resin remaining on the inner wall of via-hole-forming opening 4.

Figure 1C:
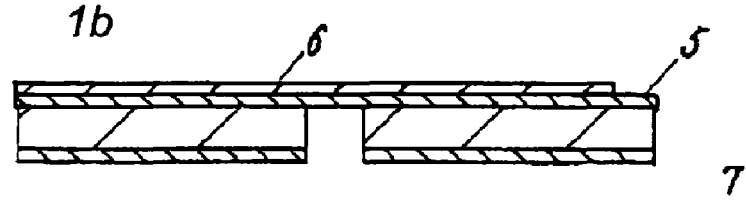

Next, as shown in FIG. 1C, plating-resistant tape 6 is adhered to the surface of metal layer 1a on double-side copper-clad laminate 3 that has no via-hole-forming opening 4 formed therethrough, except for power supply portion 5 for electrolytic plating. This plating-resistant tape 6 is used to inhibit metallic deposit formed on metal layer 1a in electrolytic plating process, which is described later. Such tapes include a polyethylene terephthalate (PET) film having an adhesive layer formed on the surface thereof.

Figure 1D:
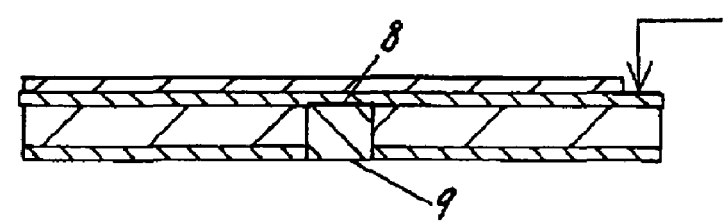

Subsequently, as shown in FIG. 1D, via post 8 is deposited by electrolytic plating process, using power supply portion for electrolytic plating 5 of metal layer 1a as plating lead 7, and thereby via hole conductor 9 is formed.

Metals used for electrolytic plating include copper, gold, nickel, and solder. It is preferable to use electrolytic copper plating.

The electrolytic plating process of this embodiment is performed using metal layer 1a as plating lead 7. Since metal layer 1a is formed over the entire surface of one side of double-side copper-clad laminate 3, the density of the electric field is substantially uniform. This allows the formation of electrolytic metallic deposit of a substantially equal height in each via-hole-forming opening 4. Moreover, since no power is supplied to metal layer 1b on double-side copper-clad laminate 3, metal does not build up on metal layer 1b and the copper foil can keep the original thickness thereof.

Once filling via-hole-forming opening 4 with metal deposit, the metallic deposit electrically connects to metal layer 1b on double-side copper-clad laminate 3 and thus metallic deposit develops on the surface of metal layer 1b. Because the plated area extends over the entire surface of metal layer 1b, the density of current that has been applied only to via-hole-forming opening 4 drastically decreases, and thus the speed of metallic deposition considerably reduces. As a result, each via post has substantially an equal height.

Figure 1E:
Figure 1F:
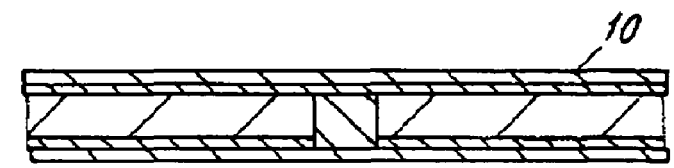
Figure 1G:
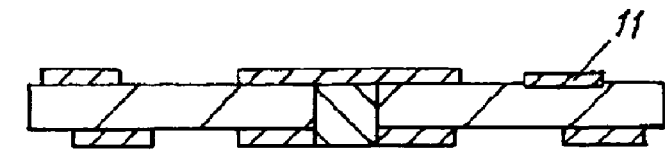

Next, as shown in FIGS. 1E to 1G, plating-resistant tape 6 adhered to metal layer 1a is delaminated, etching resists 10 are adhered onto metal layers 1a and 1b on double-side copper-clad laminate 3, and metal layers 1a and 1b are etched via masks having predetermined patterns. Thus, circuits 11 are formed.

In this etching process, first, photosensitive dry film resists are adhered onto respective surfaces of metal layers 1a and 1b or liquid photo resist is applied thereto. Subsequently, the resists are exposed to light and developed according to the predetermined circuit patterns, and thus etching resist patterns are formed. Then, part of metal layers 1a and 1b where no etching resist patterns have formed is etched and circuits 11 are provided.

Preferably used chemical solutions for etching is at least one kind selected from solutions of ferric chloride, cupric chloride, pursulfate, and sulfuric acid-hydrogen peroxide.

Figure 1H:
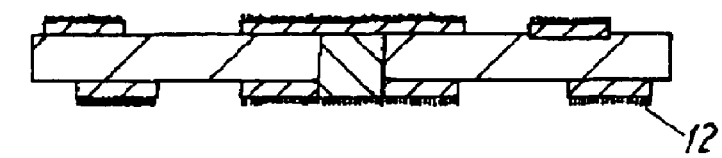

After delamination of etching resists 10, the surfaces of circuits 11 are roughened to form roughened surfaces 12, as shown in FIG. 1H.

This roughening process is performed to improve the adhesion of the circuit boards to a plurality sheets of prepreg for interlayer connection, which will be described later, and to prevent delamination in multilayering. The roughening methods include soft etching treatment, blackening (oxidation and reduction) treatment, and formation of acicular alloy plating of copper-nickel-phosphorous. After such a roughening process, Sn-layer or the like is formed over roughened surface 12 to prevent oxidation.

The via hole formed in the laminating double-side circuit board of the present invention can be filled with electro-conductive paste. However, deposit of conductive metal formed by electrolytic plating is preferable to ensure connection reliability, especially when the thickness of insulated substrate 2 is less than 100 μm.

Described next is a prepreg for interlayer connection of the present invention used to bond a plurality of laminating double-side circuit boards and connect the circuits thereof.

An uncured resin layer usable for the prepreg is made of at least one kind of heat-resistant organic resin selected from epoxy resins, polyimide resins, composite resins of epoxy resin and thermoplastic resin, composite resins of epoxy resin and silicone resin, and BT resin. When the prepreg is produced by curing a resin to the B stage (semi-cured state of resin), the above-mentioned resins may be impregnated in at least one substrate selected from aramid unwoven cloth, glass unwoven cloth, glass cloth and the like, and cured to the B stage.

Figure 2A:
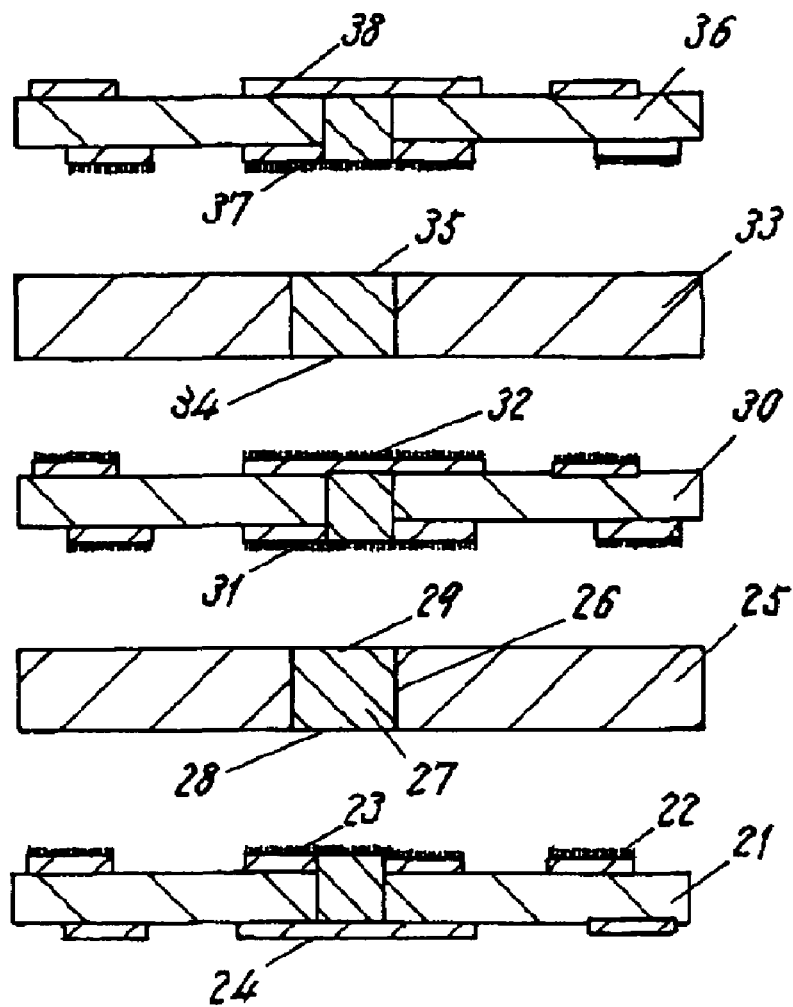
FIGS. 2A and 2B are sectional views showing a part of a process of manufacturing a multilayer printed wiring board by laminating double-side circuit boards in accordance with the present invention and sheets of prepreg.

Thereafter, through holes are drilled using carbon dioxide gas laser and the through holes are filled with electro-conductive material to provide sheets of prepreg 25 and 33 for interlayer connection as shown in FIG. 2A.

Preferably, the diameter of the via holes for interlayer connection made by filling through holes 26 for interlayer connection drilled through sheets of prepreg 25 and 33 with electro-conductive material 27 ranges 50 to 500 μm. When the diameter of the via holes for interlayer connection is less than 50 μm, ensuring connection reliability is difficult. When the diameter exceeds 500 μm, high-density wiring is difficult.

It is also preferable that electro-conductive material 27 charged into through holes 26 formed through the sheets of prepreg 25 and 33 for interlayer connection is electro-conductive paste for the following reason. When the multi-layer printed wiring board is pressed and heated during lamination, the resin in the prepreg, i.e. a substrate material, shrinks, and thus the electro-conductive paste portion is compressed. As a result, a multilayer printed wiring board having excellent connection reliability can be obtained.

Moreover, when electro-conductive paste 27 is formed to protrude from through holes 26 through the sheets of prepreg 25 and 33, further connection reliability can be ensured. In other words, after the PET films are adhered to both sides of the prepreg, the prepreg is drilled using laser, electro-conductive paste is charged into the through hole, and the PET films are delaminated, the electro-conductive paste having the thickness of the PTE film remains in the form of protrusions. By laminating press, copper particles are tightly charged into the through hole. As a result, the reliability is improved.

It is preferable to use at least one kind of metal particles selected from copper, silver, gold, and nickel or the like, as electro-conductive material in the electro-conductive paste.

The multilayer printed wiring board of the present invention is structured so that a plurality of laminating double-side circuit boards of the above-mentioned embodiment and a plurality sheets of prepreg for interlayer connection (hereinafter referred to simply as "prepreg") are alternately placed one on another and collectively laminated. The manufacturing method thereof is described using FIGS. 2A and 2B.

First, as shown in FIG. 2A, laminating double-side circuit boards 21, 30, 36, and two sheets of prepreg 25 and 33 are alternately placed one on another in the following manner.

Laminating double-side circuit board 21 is placed so that surface 24 having pads formed of a copper foil thereon forms an outermost layer of the multilayer printed wiring board. Prepreg 25 is positioned so that pad 23 on the opposite side of the circuit board is opposed to pad 28 on the prepreg, and placed on the circuit board.

Next, laminating double-side circuit board 30 is positioned and placed so that pad 31 thereon is opposed to pad 29 on prepreg 25. In addition, prepreg 33 is positioned and placed so that pad 34 thereon is opposed to pad 32 on laminating double-side circuit board 30.

Next, laminating double-side circuit board 36 is placed so that surface 38 having pads formed of a copper foil thereon forms another outermost layer of the multilayer printed wiring board. Prepreg 33 and circuit board 36 are positioned and placed so that pad 37 on the opposite side of the circuit board is opposed to pad 35 on prepreg 33.

This positioning can be made by inserting guide pins into guide holes for lamination (not shown) provided around each of the laminating circuit boards and the sheets of prepreg or by image processing.

Figure 2B:
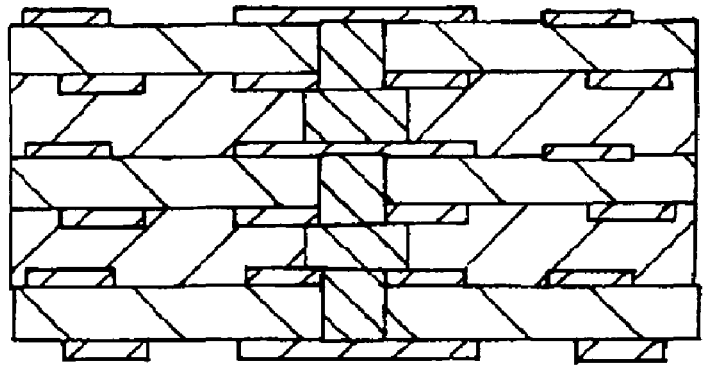
Figure 3A:
FIGS. 3A to 3E are sectional views showing a part of a process of manufacturing a conventional multilayer printed wiring board.
Figure 3B:
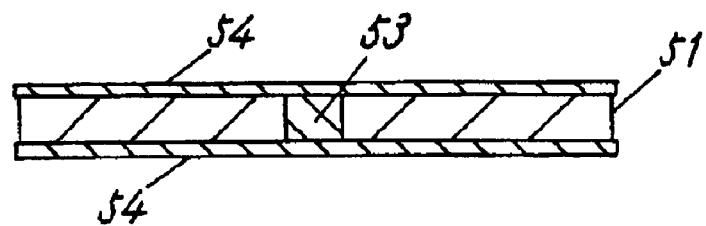
Figure 3C:
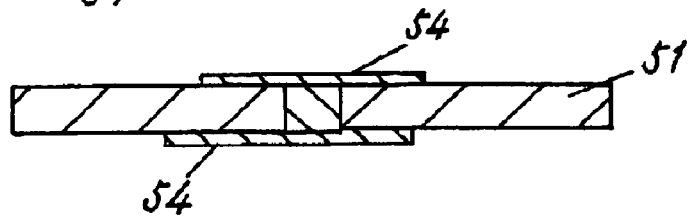
Figure 3D:
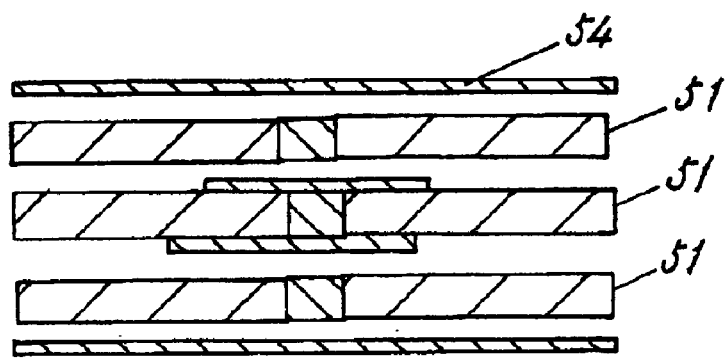
Figure 3E:
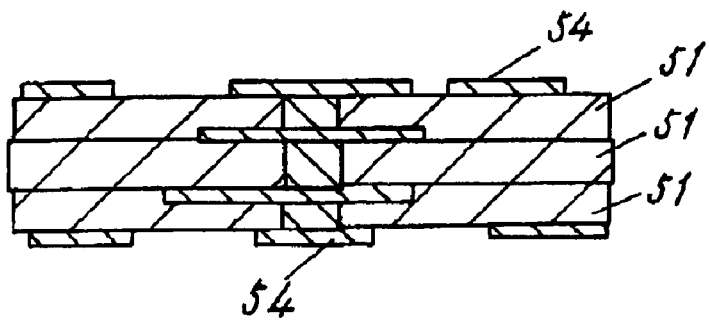

Laminating press is performed on the laminating double-side circuit boards and the sheets of prepreg laminated in the above-mentioned manner at a temperature of 180° C., using a vacuum hot press. Thus, a multilayer printed wiring board having the IVH structure throughout layers as shown in FIG. 2B can be obtained.

For each laminating double-side circuit board, the circuits and via holes thereof can be inspected prior to lamination. This can drastically improve the yields and reliability of connection between each layer.

Described next is a specific example of a multilayer printed wiring board having the IVH structure of the present invention.

After blind via holes are drilled from one side of a double-side copper-clad glass-clothepoxy resin substrate, using UV-YAG laser, the insulating-resin substrate is wetted by a solvent and desmear treatment is performed on the blind via holes, using potassium permanganate.

Next, plating-resistant tape is laminated on the other side having no blind via holes formed therethrough, except for the power supply portion, and power is supplied from the power supply portion for electrolytic copper plating. Thus, the blind via holes are filled with copper deposit.

Subsequently, the copper foils are etched via photosensitive dry film resists. Thereby, wiring patterns are formed and a laminating double-side circuit board is produced.

Thereafter, using carbon dioxide gas laser, openings are drilled through an uncured prepreg made of aramid unwoven cloth impregnated with epoxy resin, and then the openings are filled with conductive copper paste.

Three laminating double-side circuit boards and two sheets of prepreg obtained in these manners are alternately placed one on another. The laminate is pressed at a temperature of 180° C., using a vacuum hot press, to provide a multilayer printed wiring board having the IVH structure throughout layers.

In the electro-conductive copper paste charged in the prepreg, copper particles are closely bonded and cured by cure and shrinkage of the prepreg caused by the press and heat. This close bonding ensures electrical and mechanical connection between wiring layers.

For a six-layer wiring board produced in this manner, L/S=50 μm/50 μm, the diameter of each pad is 200 μm, the diameter of each via hole is 100 μm, the thickness of each conductor layer is 12 μm, and the thickness of the insulated substrate is 100 μm.

As clearly explained from the embodiments described above, the laminating double-side circuit board of the present invention is suitable for production of a multilayer printed wiring board having the IVH structure throughout layers. In other words, circuits are formed on both sides of an insulated substrate, via holes are formed through one side, and the via hole openings are filled with deposit of a conductor. This structure allows connection of the circuits formed on both sides of the insulated substrate with high reliability.

INDUSTRIAL APPLICABILITY

The diameter of the via holes provided in a laminating double-side circuit board of the present invention is smaller than that of the via holes provided through a prepreg. This structure ensures connection between each of double-side circuit board layers even when the laminating double-side circuit boards are slightly displaced with one another in positioning process during production of a multilayer printed wiring board.

In electro-conductive paste charged in the prepreg, copper particles are closely charged by compression caused by cure and shrinkage of the prepreg. This phenomenon can produce a great effect in reliability of connection between wiring layers.

Moreover, PET films are laminated on both sides of the prepreg, holes are drilled using laser and filled with electro-conductive paste, and the PET films are delaminated. As a result, the electro-conductive paste protrudes from the surfaces by the thickness of the PET film. Therefore, copper particles are further closely charged by laminating press. This process further improves the reliability.

The multilayer printed wiring board of the present invention is formed so that the via holes under the wiring patterns of the outermost layers are covered with the copper foils. This structure eliminates breakage of wire between the via holes and the pads even when the resin substrate is rapidly expanded or shrunk by thermal shocks or the like. Thus, the wiring board of the present invention has excellent connection reliability.

Moreover, the laminating double-side circuit board can be inspected in the process of production. Therefore, the yield can drastically be improved and production time of the multilayer printed wiring board can be reduced. In this manner, this invention has large industrial value.

The invention claimed is:

1. A multilayer printed wiring board comprising:
a plurality of laminating double-sided circuit boards; and
a plurality of sheets of prepreg for interlayer connection,
said plurality of sheets and said plurality of laminating double-sided circuit boards alternately located one on another to form a laminated structure,
wherein each of the double-sided circuit boards comprises:
an insulated substrate 50 to 100 μm in thickness comprising a via-hole 30 to 250 μm in diameter filled with a via-hole conductor, the substrate having two sides, each side comprising a circuit, one of said circuits comprising a metal layer comprising a first pad therein having a through-hole and filled with electro-conductive material, and the other of said circuits comprising a metal layer having a thickness ranging from 5 to 18 μm and having therein a second pad not having a through-hole, wherein:
said via-hole conductor comprises metal applied by electrolytic plating that fills said through-hole;
said circuits on both sides of said insulated substrate are connected by the via-hole conductor, the first pad on one of said laminating double-sided circuit boards and the second pad on another one of said laminating double-sided circuit boards are connected by one of said sheets of prepreg for interlayer connection, the sheet of prepreg for interlayer connection comprises a through-hole filled with electro-conductive material, and said first and second pads are on either side of the through-hole and are electrically connected with one another by the electro-conductive material in the through-holes, said through-hole in each of said sheets of prepreg has a diameter larger than that of a via-hole in each of said laminating double-sided circuit boards, and the diameter of said through-hole ranges from 50 to 500 µm.

2. The multilayer printed wiring board as set forth in claim 1, wherein both outermost layers of said multilayer printed wiring board comprise said laminating double-sided circuit boards having the pads on surfaces thereof made of metal layers.

3. The multilayer printed wiring board as set forth in claim 1, wherein each sheet of prepreg for interlayer connection comprises an uncured resin layers and said through-hole, and said through-hole is filled with the electro-conductive material.

4. The multilayer printed wiring board as set forth in claim 1, wherein each sheet of prepreg for interlayer connection comprises an uncured resin layer and at least one of an unwoven clothe and a fiber.

5. The multilayer printed wiring board as set forth in claim 1, wherein each of said sheets of prepreg for interlayer connection is made by using a carbon dioxide gas laser to drill said through-hole in each of said sheets of prepreg for interlayer connections, through an uncured prepreg of aramid unwoven cloth impregnated with epoxy resin, and by filling said through-hole with the electro-conductive material.

6. A multilayer printed wiring board comprising:
a plurality of laminating double-sided circuit boards; and
a plurality of sheets of prepreg for interlayer connection, said plurality of sheets and said plurality of laminating double-sided circuit boards alternatively located one on another form a laminated structure,
wherein each of double-sided circuit boards comprises:
an insulated substrate 50 to 100 µm in thickness comprising a via-hole 30 to 250 µm in diameter filled with a via-hole conductor, the substrate having two sides, each side comprising a circuit, one of said circuits comprising a metal layer comprising a first pad therein having a through-hole, and filled with electro-conductive material, and the other of said circuits comprising a metal layer having a thickness ranging from 5 to 18 µm and having therein a second pad not having a through-hole, wherein:

said circuits on the both sides of said insulated substrate are connected by the via-hole conductor, the first pad on one of said laminating double-sided circuit boards and the second pad on another one of said laminating double-sided circuit boards are connected by one of said sheets of prepreg for interlayer connection, the sheet of prepreg for interlayer connection comprises a through-hole filled with electro-conductive material, and said first and second pads are on either side of the through-hole and are electrically connected with one another by the electro-conductive material in through-hole, and said through-hole in each of said sheets of prepreg for interlayer connection has a diameter larger than that of a via-hole in each of said laminating double-sided circuit boards, and the diameter of said through-hole ranges from 50 to 500 µm.

7. The multilayer printed wiring board as set forth in claim 6, wherein both outermost layers of said multilayer printed wiring board comprise said laminating double-sided circuit boards having the pads on surfaces thereof made of metal layers.

8. The multilayer printed wiring board as set forth in claim 6, wherein each sheet of prepreg for interlayer connection comprises an uncured resin layer and said through-hole, and said through-hole is filled with the electro-conductive material.

9. The multilayer printed wiring board as set forth in claim 6, wherein each sheet of prepreg for interlayer connection comprises an uncured resin layer and at least one of an unwoven clothe and a fiber.

10. The multilayer printed wiring board as set forth in claim 6, wherein each of said sheets of prepreg for interlayer connection is made by using a carbon dioxide gas laser to drill said through-hole in each of said sheets of prepreg for interlayer connection, through an uncured prepreg of aramid unwoven clothe impregnated with epoxy resin, and by filling said through-hole with the electro-conductive material.

* * * * *